Nov. 9, 1965 B. ZUK 3,217,181

LOGIC SWITCHING CIRCUIT COMPRISING A PLURALITY OF DISCRETE INPUTS

Filed Sept. 11, 1962

INVENTOR.
BORYS ZUK

BY John V. Regan
Attorney

United States Patent Office 3,217,181
Patented Nov. 9, 1965

3,217,181

LOGIC SWITCHING CIRCUIT COMPRISING A PLURALITY OF DISCRETE INPUTS

Borys Zuk, Somerville, N.J., assignor to Radio Corporation of America, a corporation of Delaware Filed Sept. 11, 1962, Ser. No. 222,828
13 Claims. (Cl. 307—88.5)

Figures 1, 2:
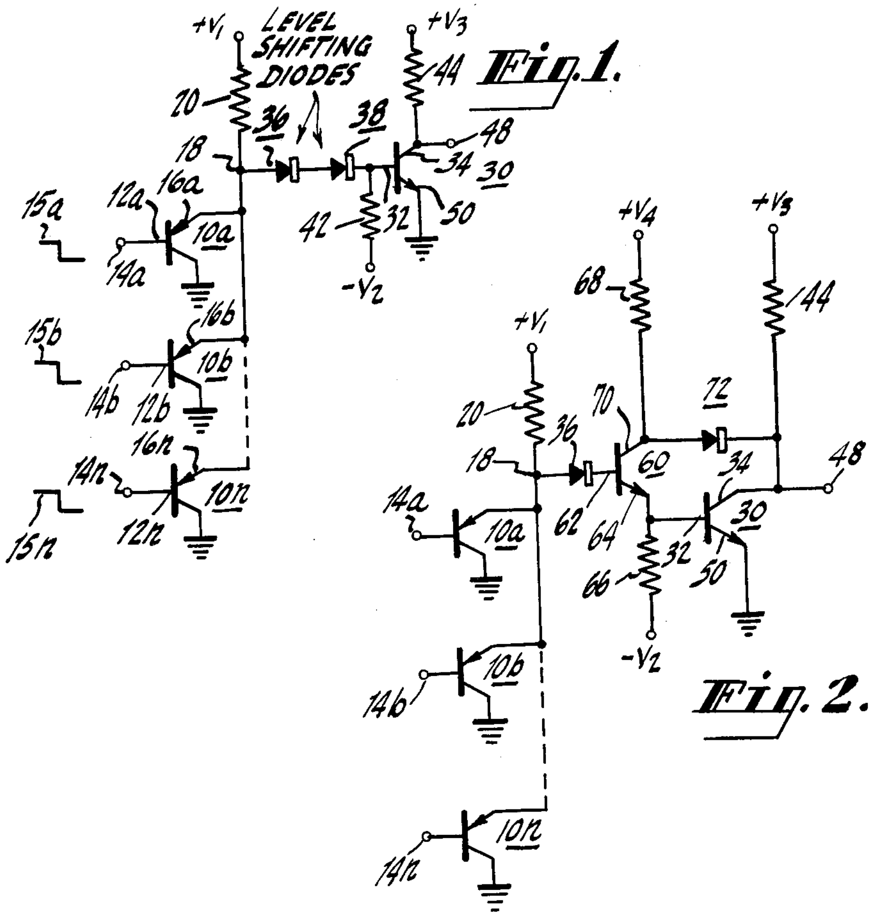

This invention relates to electrical circuits and, in particular, to logic circuits.

Various approaches to integrated circuits, their advantages and characteristics, are described in an article entitled, "Integrated Electronics—A Survey," by H. Kihn, in the RCA Engineer, volume 7, No. 6, at page 14. Among the characteristics desired in an integrated circuit are low overall power dissipation, absence of capacitors, a minimum number of passive elements, high noise immunity and relaxed component value tolerance, especially of the passive elements.

It is one object of this invention to provide logic circuits which lend themselves readily to miniaturization and integration.

It is another object of this invention to provide logic circuits which have the desired characteristics aforementioned.

It is yet another object of the invention to provide means for controlling the degree of saturation in a transistor inverter.

A logic circuit according to the invention may include a number of input transistors of a first conductivity type connected in the common collector configuration. The emitter electrodes of the input transistors are connected together and to one end of a common emitter resistor. An output transistor of opposite conductivity type is connected in the common emitter configuration, and has its base electrode connected to the emitters of the input transistors by level shifting means. The voltage applied at the other end of the common emitter resistor is such that the level shifting means maintains the output transistor in a cutoff condition whenever one or more of the input transistors is "on," and maintains the output transistor in the "on" condition whenever all of the input transistors are in the nonconducting condition.

In accordance with another feature of the invention, the emitter electrode of a first transistor is directly connected to the base electrode of a second transistor of the same conductivity type. The collector electrodes of these transistors are connected together by means of a diode poled to conduct collector current of the second transistor in the easy current flow direction of the diode.

Figure 3:
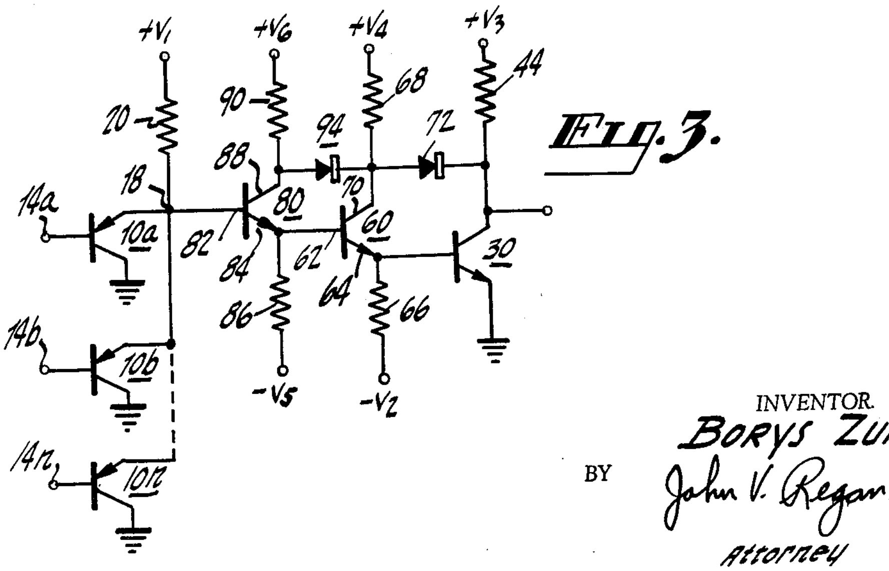

In the accompanying drawing, like reference characters refer to like components and:

FIGURE 1 is a schematic diagram of a positive NAND or negative NOR logic circuit; and FIGURES 2 and 3 are schematic drawings of modified forms of the logic circuit of FIGURE 1 and include means for controlling the degree of transistor saturation.

The FIGURE 1 logic circuit includes a number of transistors 10$a$ . . . 10$n$ of one conductivity type connected in the grounded collector configuration. In FIGURE 1, the transistors 10$a$ . . . 10$n$ are shown as being PNP transistors, by way of example. The base electrodes 12$a$ . . . 12$n$ are connected to input terminals 14$a$ . . . 14$n$, respectively, to which input signals or levels 15$a$ . . . 15$n$ may be applied individually and selectively for controlling the operating states of the transistors 10$a$ . . . 10$n$. All of the emitter electrodes 16$a$ . . . 16$n$ are connected to a common junction point 18, and a common emitter resistor 20 is connected between the junction point 18 and a source of suitable biasing potential, designated $+V_1$. This bias source may be, for example, a battery (not shown) having its positive terminal connected to the upper terminal of common emitter resistor 20, and having its negative terminal grounded.

An output transistor 30 of opposite conductivity type, NPN in this case, is connected in the grounded emitter configuration and has a base electrode 32 and a collector electrode 34. The base electrode 32 is coupled to the common junction point 18 by level shifting means in the form of one or more serially-connected level shifting diodes. Two such diodes 36 and 38 are illustrated in the drawing. These diodes 36, 38 are high-charge, storage diodes which have well-defined conducting thresholds. Other types of level shifting means, such as other nonlinear conducting devices, may be employed, depending upon circuit application, but diodes of the type described are preferred for reasons which will be discussed hereinafter. The particular number of diodes employed in the level shifting network is determined by the temperature range over which the circuit is required to operate, the forward voltage drops across the diodes, and the amount of level shift desired.

A resistor 42 may be connected between the base electrode 32 and a source of negative biasing potential, designated $-V_2$. Another resistor 44 may be connected between the collector electrode 34 and a source of biasing potential, designated $+V_3$. Both of the $V_2$ and $V_3$ bias sources may be batteries, for example. The output at the collector 34 may be supplied to inputs of other, similar logic circuits. Resistors 42 and 44 and their associated power supplies are not essential to the operation of the circuit and may be eliminated, for example, if the ambient temperature is closely controlled. Inasmuch as the "$I_{c0}$" of a transistor varies with change in temperature, the voltage at the collector 34 will vary with change in temperature. Such a change in voltage may be sufficient to result in false triggering of the transistor (not shown) in the following stage in the absence of resistor 44 and the $+V_3$ source. This false triggering can be prevented by including the resistor 44 and voltage source $+V_3$ to fix the minimum "off" collector 34 voltage of transistor 30 at a sufficiently positive value to prevent false triggering under worst case temperature conditions when the transistor 30 is nonconducting. Resistor 42 and associated bias source $-V_2$ insure circuit stability when the temperature varies over wide limits by compensating for changes in the conductivity of the level shifting diodes 36, 38, and by supplying $I_{c0}$ current for the output transistor 30. Generally speaking, the resistor 42 is chosen to have a relatively high value of resistance, since this resistor 42 ideally must supply only the maximum $I_{c0}$ current for transistor 30 and maximum leakage current for the diodes 36, 38.

Consider now the operation of the FIGURE 1 circuit and assume that the individual inputs 15$a$ . . . 15$n$ applied at the input terminals 14$a$ . . . 14$n$ are either at ground potential or at approximately $+V_3$ volts. A signal of ground potential applied at any one or more of the input terminals 14$a$ . . . 14$n$ turns on the associated one of the input transistors 10$a$ . . . 10$n$. The voltage at the common emitter junction 18 then assumes a value which is more positive than ground potential by an amount approximately equal to the forward base-emitter voltage drop of the conducting input transistor. The combined forward voltage drops across the level shifting diodes 36 and 38 are greater than the forward base-emitter drop of a conducting input transistor. Accordingly, the voltage at the base electrode 32 of output transistor 30 then is negative with respect to ground, output transistor 30 is nonconducting, and the output voltage at terminal 48 is approximately $+V_3$ volts. It is thus seen that the output transistor 30 does not conduct when any of the input transistors 10$a$ . . . 10$n$ is in the state of high conduction. Accordingly, little or no power is dissipated in the output resistor 44 at this time.

Consider now the operation of the circuit when all of the signals 15$a$ . . . 15$n$ applied at input terminals 14$a$ . . . 14$n$ are at approximately $+V_3$ volts. In the absence of the level shifting diodes 36, 38 and output transistor 30, the voltage at the common emitter junction 18 would rise to a value close to $+V_3$ volts due to emitter follower action. However, because the total forward voltage drop across level shifting diodes 36, 38 is less than $+V_3$ volts, output transistor 30 is biased into saturation before the voltage at the junction 18 rises to $+V_3$ volts. Accordingly, the input transistors 10$a$ . . . 10$n$ become nonconducting since the common emitter junction 18 is clamped at a voltage which is negative relative to the voltages at the bases 12$a$ . . . 12$n$, respectively. Level shifting diodes 36 and 38 conduct heavily at this time and supply current, in the conventional sense, to the base 32 from the $+V_1$ source. The output voltage at the collector 34 then is close to ground potential, and a low impedance is presented to the following stage (not shown).

The amount of charge stored in the level shifting diodes 36, 38 is a function of the current flowing through the diodes. This stored charge is used to provide a hard turn-off overdrive for the output transistor 30 whenever any of the input voltages 15$a$ . . . 15$n$ drops to ground potential. Preferably, the total Q of the diodes 36, 38 should be greater than the base Q of the output transistor 30, where $Q=CV$, in order to provide the hard turn-off overdrive. Since both the Q of the diodes 36, 38 and the Q of the transistor 30 vary in the same relative direction with temperature, a change in temperature does not affect the turn-off characteristic of the circuit. If a fixed capacitor were used in the level shifting network, it would be necessary to choose a capacitor which was large enough to turn off the output transistor 30 at the highest anticipated temperature.

The FIGURE 1 circuit has the following desirable characteristics. The input impedance between input terminals 14$a$ . . . 14$n$ and ground is high, whereby only small input currents are required to drive the transistors 10$a$ . . . 10$n$. The output impedance of the circuit is low, whereby the circuit can drive many other circuits of the type illustrated in FIGURE 1 without requiring a high current gain in transistor 30 and without accompanying high power dissipation in resistor 44 and transistor 30. Power dissipation in the circuit also is low because the output transistor 30 does not conduct when any of the input transistors 10$a$ . . . 10$n$ is conducting, and vice versa. This is important in an integrated structure. The value of common emitter resistor 20 also can vary over a fairly large range without affecting circuit operation because the current is taken up by the collector-emitter paths of one or more of the input transistors 10$a$ . . . 10$n$ and does not flow through the base 12$a$ . . . 12$n$ circuits to the output of the driver stages (not shown).

Another important feature of the FIGURE 1 circuit is its immunity to spurious noise signals. As mentioned previously, the charge stored in the level shifting diodes 36, 38 is a function of the current flowing through these diodes, and is very small when the output transistor 30 is nonconducting. If a fixed capacitor were used in the level shifting network, the voltage at the base electrode 32 might be clamped, and any noise on the ground plane (emitter 50) might turn on the output transistor 30. This problem is eliminated for practical purposes in the FIGURE 1 circuit because of the small charge on the diodes 36, 38 when output transistor 30 is nonconducting. Another important advantage of the circuit is that the circuit lends itself readily to integration and may, in fact, be readily manufactured on a single chip of semiconductor material.

Although the FIGURE 1 circuit has been illustrated and described as employing PNP type input transistors and an NPN output transistor, NPN input transistors and a PNP output transistor could be employed, provided that the polarities of the various voltage sources are reversed and provided further that the connections to the level shifting diodes 36 and 38 are reversed. By way of example only, a circuit of the type illustrated in FIGURE 1 may have the following component values:

| | |
|---|---|
| Resistor **20** | 3.9K ohms. |
| Resistor **42** | 30K ohms. |
| Resistor **44** | 2K ohms. |
| Voltage source $V_1$ | 9 volts. |
| Voltage source $V_2$ | 3 volts. |
| Voltage source $V_3$ | 3 volts. |
| Transistors **10**$a$ . . . **10**$n$ | 2N995. |
| Transistor **30** | 2N709. |
| Diodes **36** and **38** | 1N914 with $trr>4$ nanosec. |

It may be desired in some applications to drive a greater number of output loads than is possible with the FIGURE 1 configuration. Greater driving capability may be attained by modifying the FIGURE 1 circuit in the manner illustrated in FIGURE 2. In FIGURE 2, the level shifting diode 38 is replaced by a second NPN transistor 60 connected as an emitter-follower and having its base electrode 62 connected to the cathode of the level shifting diode 36. The emitter electrode 64 of this transistor 60 is directly connected to the base electrode 32 of the output transistor 30 and is connected to a source of voltage, designated $-V_2$, by way of a resistor 66. A resistor 68 is connected between the collector electrode 70 and a source of voltage, designated $+V_4$. A diode 72 may be connected between the collector electrodes 34 and 70 when high speed operation is desired. In that event, the diode 72 is poled, or connected, to conduct collector current for the transistor 30 in the forward, or easy current flow, direction of the diode 72.

The circuit of FIGURE 2 operates substantially the same as the circuit of FIGURE 1. When any one or more of the input transistors 10$a$ . . . 10$n$ is conducting, the voltage at the common emitter junction 18 is only slightly positive with respect to ground. Second transistor 60 then is in a condition of light conduction, but the voltage at the emitter 64 is negative relative to ground because of the voltage drops across the level shifting diode 36 and the base 62-emitter 64 diode. Accordingly, output transistor 30 is nonconducting and the output voltage at terminal 48 is approximately $+V_3$ volts.

Second transistor 60 is driven into heavy conduction when all of the input signals rise to $+V_3$ volts. The increased current flowing through resistor 66 raises the voltage at emitter 64 above ground potential, whereupon the output transistor 30 turns on. Absent the diode 72, the current supplied by the $+V_4$ volt source flows through the collector 70-emitter 64 path and is supplied in large measure to the base 32 of output transistor 30, driving output transistor 30 into heavy saturation. The output drive capability of transistor 30 is much greater in the FIGURE 2 circuit than in the FIGURE 1 circuit because of the current gain provided by second transistor 60.

When high speed operation is desired, output transistor 30 and second transistor 60 should turn off rapidly when one of the input signals falls to ground potential. Second transistor 60 is turned off rapidly by the charge stored in the level shifting diode 36. However, output transistor 30 does not recover from saturation until the minority charge carriers stored in its base region are removed. The recovery time is a function of the degree of saturation. Thus, for high speed operation, it is desirable either to limit the degree of saturation into which output transistor 30 is driven, or to prevent saturation.

One known method of obtained high current gain without saturating the output transistor is to connect the collector electrodes 34 and 70 directly together. In that event, collector 34 is always more positive than base 32 inasmuch as the collector 70 is more positive than emitter 64. However, power dissipation is greater in an unsaturated transistor than in a saturated transistor, and this greater power dissipation is especially undesirable in an integrated, miniaturized structure. Furthermore, the collector voltage in an unsaturated transistor may fluctuate and cause false triggering in the driven circuits.

High current gain with controlled saturation is accomplished by connecting diode 72 between collectors 34 and 70. Diode 72 is connected, or poled, so that it passes forward current to the collector 34 when the diode is forward biased. As mentioned previously, the voltage at the collector 70 always is slightly more positive than the voltage at the emitter 64 when second transistor 60 is in heavy conduction. Diode 72 clamps the collector 34 voltage at a value which is less positive than the collector 70 voltage by an amount equal to the forward voltage drop of the diode 72. This forward voltage drop is selected to be slightly greater than the voltage appearing between collector 70 and emitter 64, whereby the collector 34 voltage is allowed to become only slightly negative with respect to the base 32 voltage. That is to say, transistor 30 is allowed to be driven only into light saturation. The particular degree of saturation is controlled by selecting a diode 72 which has a desired forward voltage drop relative to the collector 70-emitter 64 voltage drop in the full "on" condition of second transistor 60.

The concept of controlled saturation can be viewed from another standpoint. Essentially, diode 72 limits the base drive to the output transistor 30 in the following manner. Absent the diode 72, current supplied through collector resistor 68 from the $+V_4$ volt source flows through the collector 70-emitter 64 path and, in large measure, into the base 32 of output transistor 30. With the diode 72 connected in the circuit and forward biased, a portion of the resistor 68 current is shunted through the diode 72 and away from the base 32, thereby reducing the base 32 drive.

By way of example only, a circuit of the type illustrated in FIGURE 2 may have the following component values:

| | |
|---|---|
| Resistor **20** | 3.9K ohms. |
| Resistor **44** | 510 ohms. |
| Resistor **66** | 680 ohms. |
| Voltage source $V_1$ | 9 volts. |
| Voltage sources $V_2$, $V_3$ and $V_4$ | 3 volts. |
| Transistors **10***a* . . . **10***n* | 2N995. |
| Transistor **30** | 2N744. |
| Transistor **60** | 2N709. |
| Diode **36** | 1N914 with *trr*>4 nano sec. |
| Diode **72** | 1N914. |

1N914 with

A circuit with still greater output drive capability is illustrated schematically in FIGURE 3. This circuit differs from the FIGURE 2 circuit in that the level shifting diode 36 is replaced by a third NPN transistor 80, connected as an emitter follower and having its base electrode 82 connected directly to the common emitter junction 18. Emitter electrode 84 is connected directly to the base 62 of second transistor 60, and is connected by way of a resistor 86 to a source of bias potential, designated $-V_5$. Collector 88 current is supplied from a bias source, designated $+V_6$, by way of a collector supply resistor 90.

The major advantage of replacing the level shifting diodes 36, 38 (FIGURE 1) with transistors 80, 60 is that a very large current amplification can be obtained. Actually, it is as easy to fabricate a transistor in an integrated structure as it is to fabricate a diode. It should be noted that the input impedance to the FIGURE 3 circuit is high, comparable to that of FIGURES 1 and 2, even though the circuit can supply a large output current.

For high speed operation, it is desirable to connect a diode 94 between the collector electrodes 80, 88 of the second and third transistors 60 and 80, respectively. This diode 94 reduces stage delay by controlling the degree of saturation into which the second transistor 60 may be driven when one or more of the input signals falls to ground potential. The operation of diode 94 is similar to that of the diode 72 described previously.

By way of example, a circuit of the type illustrated in FIGURE 3 may have the following values:

| | | |
|---|---|---|
| Resistor **20** | ohms | 3.9K |
| Resistor **44** | do | 15 |
| Resistor **66** | do | 150 |
| Resistor **68** | do | 10 |
| Resistor **86** | do | 750 |
| Resistor **90** | | zero |
| Voltage source $V_1$ | volts | 9 |
| Voltage sources $V_3$, $V_4$, $V_6$, $V_2$ and $V_5$ | do | 3 |
| Transistors **10a . . . 10n** | | 2N995 |
| Transistor **30** | | 2N744 |
| Transistor **60** | | 2N744 |
| Transistor **80** | | 2N709 |
| Diodes **72, 94** | | 1N914 |

What is claimed is:

1. The combination comprising:

a plurality of input transistors of a first conductivity type each connected in the common collector configuration and each having a base electrode and an emitter electrode;

a resistor connected directly in common with the emitter electrode of each input transistor;

a separate input terminal for each said base electrode;

an output transistor of opposite conductivity type connected in the common emitter configuration and having a base electrode and a collector electrode;

level shifting means connected between the emitter electrodes of said input transistors and the base electrode of said output transistor; and output means connected at the collector electrode of said output transistor.

2. The combination comprising:

a plurality of input transistors of a first conductivity type each connected in the common collector configuration and each having a base electrode and an emitter electrode;

a resistor connected directly in common with the emitter electrode of each input transistor;

a separate signal input terminal for each said base electrode;

an output transistor of opposite conductivity type connected in the common emitter configuration and having a base electrode and a collector electrode;

at least one unidirectional conducting device connected between the emitter electrodes of said input transistors and the base electrode of said output transistor, said device being poled in a direction to conduct forward base current for said output transistor; and output means connected at the collector electrode of said output transistor.

3. The combination comprising:

a plurality of input transistors of a first conductivity type each connected in the common collector configuration and each having a base electrode and an emitter electrode;

a resistor connected directly in common with the emitter electrode of each input transistor;

a separate signal input terminal for each said base electrode;

an output transistor of opposite conductivity type connected in the common emitter configuration and having a base electrode and a collector electrode;

a level shifting diode connected between the emitter electrodes of said input transistors and the base electrode of said output transistor, said diode being poled to conduct forward base current for said output transistor in the easy current flow direction of said diode; and output means connected at the collector electrode of said output transistor.

4. The combination comprising:
a plurality of input transistors of a first conductivity type each connected in the common collector configuration and having a base electrode and an emitter electrode;
a resistor having one terminal connected directly in common to each said emitter electrode;
means for applying a bias voltage between the other terminal of said resistor and a point of reference potential;
an output transistor of a second conductivity type, opposite said first conductivity type, connected in the common emitter configuration and having a base electrode and a collector electrode;
level shifting means, including at least one nonlinear conducting device having a conducting threshold, connected between said one terminal of said resistor and said base electrode of said output transistor; and
an output terminal connected to the collector electrode of said output transistor.

5. The combination comprising:
a plurality of input transistors of a first conductivity type each connected in the common collector configuration and having a base electrode and an emitter electrode;
a resistor having one terminal connected directly in common to each said emitter electrode;
means for applying a bias voltage between the other terminal of said resistor and a point of reference potential;
an output transistor of a second conductivity type, opposite said first conductivity type, connected in the common emitter configuration and having a base electrode and a collector electrode;
level shifting means, including at least one nonlinear conducting device having a conducting threshold, connected between said one terminal of said resistor and said base electrode of said output transistor;
a second resistor having one terminal connected to said base electrode of said output transistor;
means for applying a bias voltage at the free end of said second resistor, said bias voltage having a polarity tending to reverse bias the emitter-base diode of said output transistor; and
an output terminal connected to the collector electrode of said output transistor.

6. The combination comprising:
a plurality of input transistors of a first conductivity type each connected in the common collector configuration and having a base electrode and an emitter electrode;
a resistor having one terminal connected directly in common to each said emitter electrode;
means for applying a bias voltage between the other terminal of said resistor and a point of reference potential;
an output transistor of a second conductivity type, opposite said first conductivity type, connected in the common emitter configuration and having a base electrode and a collector electrode;
level shifting means, including at least one nonlinear conducting device having a conducting threshold, connected between said one terminal of said resistor and said base electrode of said output transistor;
a second resistor having one terminal connected to said base electrode of said output transistor;
means for applying a bias voltage at the free end of said second resistor, said bias voltage having a polarity tending to reverse bias the emitter-base diode of said output transistor; and
means for applying operating potential to the collector electrode of said output transistor to normally reverse bias the collector-base diode of said output transistor.

7. The combination comprising:
a plurality of transistors of a first conductivity type connected in the common collector configuration and each having a base electrode and an emitter electrode;
means for applying input signals selectively to individual ones of the base electrodes;
a resistor having one terminal connected directly in common to each said emitter electrode;
an output transistor of opposite conductivity type to said first type connected in the common emitter configuration and having a base electrode and a collector electrode;
a second transistor of said opposite conductivity type having an emitter electrode connected directly to the base electrode of said output transistor, a base electrode and a collector electrode;
coupling means connected between said one terminal of said resistor and the base electrode of said second transistor;
a second resistor having one terminal connected to the emitter electrode of said second transistor; and
means for applying biasing potentials to the other terminals of the first and second resistors and to the collector electrodes of said output transistor and said second transistor.

8. The combination comprising:
a number of transistors of a first conductivity type connected in the common collector configuration and each having a base electrode and an emitter electrode;
means for applying input signals selectively to individual ones of the base electrodes;
a resistor having one terminal connected to each said emitter electrode;
an output transistor of opposite conductivity type to said first type connected in the common emitter configuration and having a base electrode and a collector electrode;
a second transistor of said opposite conductivity type having an emitter electrode connected directly to the base electrode of said output transistor, a base electrode and a collector electrode;
level shifting means connected between said one terminal of said resistor and the base electrode of said second transistor;
a second resistor having one terminal connected to the emitter electrode of said second transistor;
a unidirectional conducting device connected between the collector electrodes of said output transistor and said second transistor and poled in a direction to conduct current flowing in the collector of said output transistor; and
means for applying biasing potentials to the other terminals of the first and second resistors and to the collector electrodes of said output transistor and said second transistor.

9. The combination comprising:
a plurality of transistors of one conductivity type connected in the common collector configuration and each having a base electrode and an emitter electrode;
means for selectively applying input signals individually to each said base electrode;
a first resistor having one terminal connected directly in common to each said emitter electrode;
an output transistor of the opposite conductivity type connected in the common emitter configuration and having a base electrode and a collector electrode;
a second transistor of said opposite conductivity type having an emitter electrode connected directly to the base electrode of said output transistor, a base electrode and a collector electrode;
means for applying operating potentials to the collector electrodes of said output transistor and said second transistor;
a nonlinear conducting device having a conduction threshold connected between said one terminal of said first resistor and the base electrode of said second transistor;

a second resistor having one terminal connected to the emitter electrode of said second transistor and the base electrode of said output transistor; and bias means connected between the other terminals of said first and second resistors and having a polarity and magnitude tending to normally bias said nonlinear device above its conduction threshold and to forward bias the emitter-base diode of said second transistor.

10. The combination as claimed in claim 9 wherein said nonlinear device is a diode, and wherein said diode is poled to conduct forward base current for said second transistor in its easy current flow direction.

11. The combination comprising:

a number of input transistors of a first conductivity type each connected in the common collector configuration and having a base electrode and an emitter electrode;

means for applying input signals to the base electrodes of said input transistors;

a first resistor having one terminal connected to each said emitter electrode;

an output transistor of opposite conductivity type connected in the common emitter configuration and having a base electrode and a collector electrode;

a second transistor of said opposite conductivity type having an emitter electrode connected directly to the base electrode of said output transistor, a base electrode and a collector electrode;

a third transistor of said opposite conductivity type having an emitter electrode connected directly to the base electrode of said second transistor, an emitter electrode and a collector electrode;

a direct-current connection between said one terminal of said first resistor and the base electrode of said third transistor;

a second resistor having one terminal connected to the emitter electrode of said third transistor;

means for applying operating potentials to the other terminals of said first and second resistors having a polarity and magnitude tending to normally forward bias the base-emitter diode of said third transistor;

a third resistor having one terminal connected to the base electrode of said output transistor;

means for applying a bias potential to the other terminal of said third resistor having a polarity and magnitude tending to normally reverse bias the base-emitter diode of said output transistor; and means for applying operating potentials to the collector electrodes of said output transistor and said second and third transistors.

12. the combination comprising:

a number of input transistors of a first conductivity type each connected in the common collector configuration and having a base electrode and an emitter electrode;

means for applying input signals to the base electrodes of said input transistors;

a first resistor having one terminal connected to each said emitter electrode;

an output transistor of opposite conductivity type connected in the common emitter configuration and having a base electrode and a collector electrode;

a second transistor of said opposite conductivity type having an emitter electrode connected directly to the base electrode of said output transistor, a base electrode and a collector electrode;

a third transistor of said opposite conductivity type having an emitter electrode connected directly to the base electrode of said second transistor, an emitter electrode and a collector electrode;

a direct-current connection between said one terminal of said first resistor and the base electrode of said third transistor;

a second resistor having one terminal connected to the emitter electrode of said third transisitor;

means for applying operating potentials to the other terminals of said first and second resistors having a polarity and magnitude tending to normally forward bias the base-emitter diode of said third transistor;

a third resistor having one terminal connected to the base electrode of said output transistor;

means for applying a bias potential to the other terminal of said third resistor having a polarity and magnitude tending to normally reverse bias the base-emitter diode of said output transistor;

a first diode connected between the collector electrodes of said output transistor and said second transistor;

a second diode connected between the collector electrodes of said third transistor and said second transistor; and means for applying operating potentials to the collector electrodes of said output transistor and said second and third transistors.

13. The combination comprising:

an output transistor of one conductivity type connected in the common emitter configuration and having a base electrode and a collector electrode;

a second transistor of the same conductivity type having an emitter electrode connected by negligible impedance means to the base electrode of said output transistor, a base electrode and a collector electrode;

means for applying input signals to the base electrode of said second transistor;

a first resistor having one terminal connected to the base electrode of said output transistor;

means for applying a bias voltage at the other end of said first resistor having a polarity tending to normally reverse bias the emitter-base diode of said output transistor;

separate collector supply resistors connected respectively to the collector electrodes of said output transistor and said second transistor; and a diode connected between said collector electrodes and poled to conduct collector current of said output transistor in its easy current flow direction.

References Cited by the Examiner

UNITED STATES PATENTS

| | | | |
|---|---|---|---|
| 2,962,604 | 11/60 | Britain | 307—88.5 |
| 2,964,653 | 12/60 | Cagle et al. | 307—88.5 |
| 2,986,652 | 5/61 | Eachus | 307—88.5 |
| 3,020,417 | 2/62 | Sheilik | 307—88.5 |
| 3,031,588 | 4/62 | Hilsenrath | 307—88.5 |
| 3,079,513 | 2/63 | Yokelson | 307—88.5 |

OTHER REFERENCES

Hurley: Junction Transistor Electronics, John Wiley & Son, New York, 1959, pages 391–400.

Marsoccic: Semiconductors Products, January 1961, vol. 4, No. 1.

JAMES D. KALLAM, *Primary Examiner.*

DAVID J. GALVIN, *Examiner.*